United States Patent
Miyashita et al.

[11] Patent Number: 5,878,191
[45] Date of Patent: Mar. 2, 1999

[54] HEAT TREATMENT APPARATUS FOR SEMICONDUCTOR WAFERS

[75] Inventors: Naoto Miyashita; Ichiro Katakabe; Hiroshi Kawamoto, all of Yokohama; Kenji Doi, Kawasaki; Tsuyoshi Okuda, Tokyo, all of Japan

[73] Assignee: Kabushiki Kaisha Toshiba, Kawasaki, Japan

[21] Appl. No.: 451,509

[22] Filed: May 26, 1995

[30] Foreign Application Priority Data

May 30, 1994 [JP] Japan .................................. 6-117046

[51] Int. Cl.⁶ .................................................. C23L 16/00
[52] U.S. Cl. ........................ 392/416; 219/390; 118/725; 118/50.1
[58] Field of Search ..................... 219/390, 405, 219/411; 392/416, 418; 118/724, 725, 50.1; 373/136; 427/553, 557, 559; 432/77, 83, 152; 437/247, 248

[56] References Cited

U.S. PATENT DOCUMENTS

| | | | |
|---|---|---|---|
| 4,195,820 | 4/1980 | Berg | 219/390 |
| 4,882,468 | 11/1989 | Bouchon | 219/390 |
| 4,883,424 | 11/1989 | Sakai et al. | 432/77 |
| 5,053,247 | 10/1991 | Moore | 118/725 |
| 5,097,890 | 3/1992 | Nakao | 118/724 |
| 5,207,835 | 5/1993 | Moore | 118/725 |
| 5,239,614 | 8/1993 | Ueno et al. | 392/416 |
| 5,346,555 | 9/1994 | Nunotani et al. | 118/724 |
| 5,360,336 | 11/1994 | Monoe | 432/77 |
| 5,507,639 | 4/1996 | Monoe | 432/77 |

FOREIGN PATENT DOCUMENTS 63-232422  9/1988  Japan .

*Primary Examiner*—Teresa J. Walberg
*Assistant Examiner*—J. Pelham
*Attorney, Agent, or Firm*—Finnegan, Henderson, Farabow, Garrett & Dunner, L.L.P.

[57] ABSTRACT

A heat treatment apparatus for semiconductor wafers includes a reaction chamber, a heater, a heat-insulating member, a first cooling gas path, a second cooling gas path, a blower and a controller. The reaction chamber houses semiconductor wafers. The heater is provided outside the reaction chamber to heat it. The heat-insulating member is provided outside the heater to keep the temperature of the reaction chamber. The first cooling gas path is interposed between the reaction chamber and heater, while the second cooling gas path is disposed between the heater and heat-insulating member. The blower allows gas to flow through the first and second gas paths to cool the reaction chamber. The controller controls the heater to increase the temperature of the reaction chamber and does the blower to decrease the temperature thereof.

62 Claims, 11 Drawing Sheets

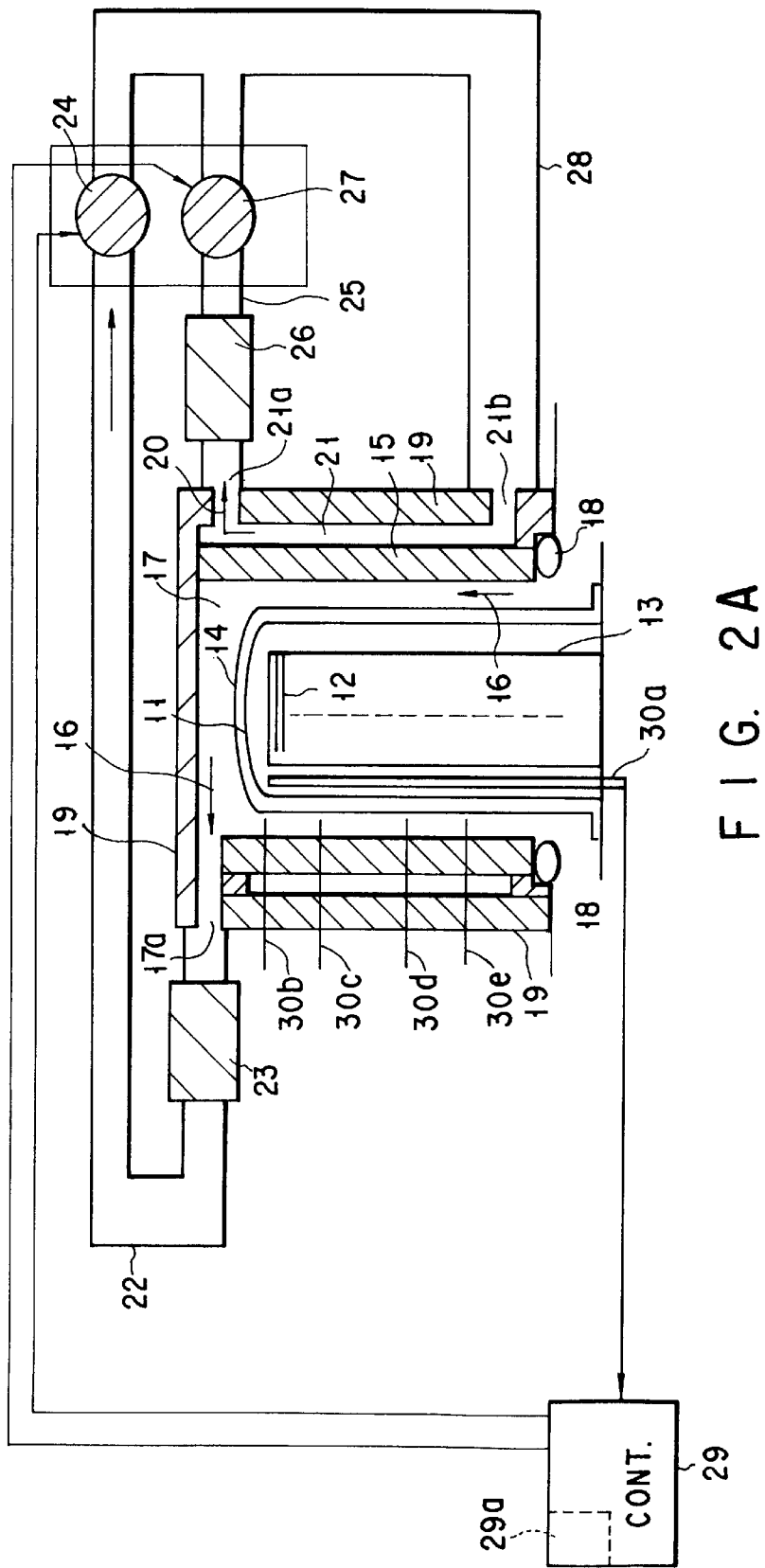
F I G. 2A

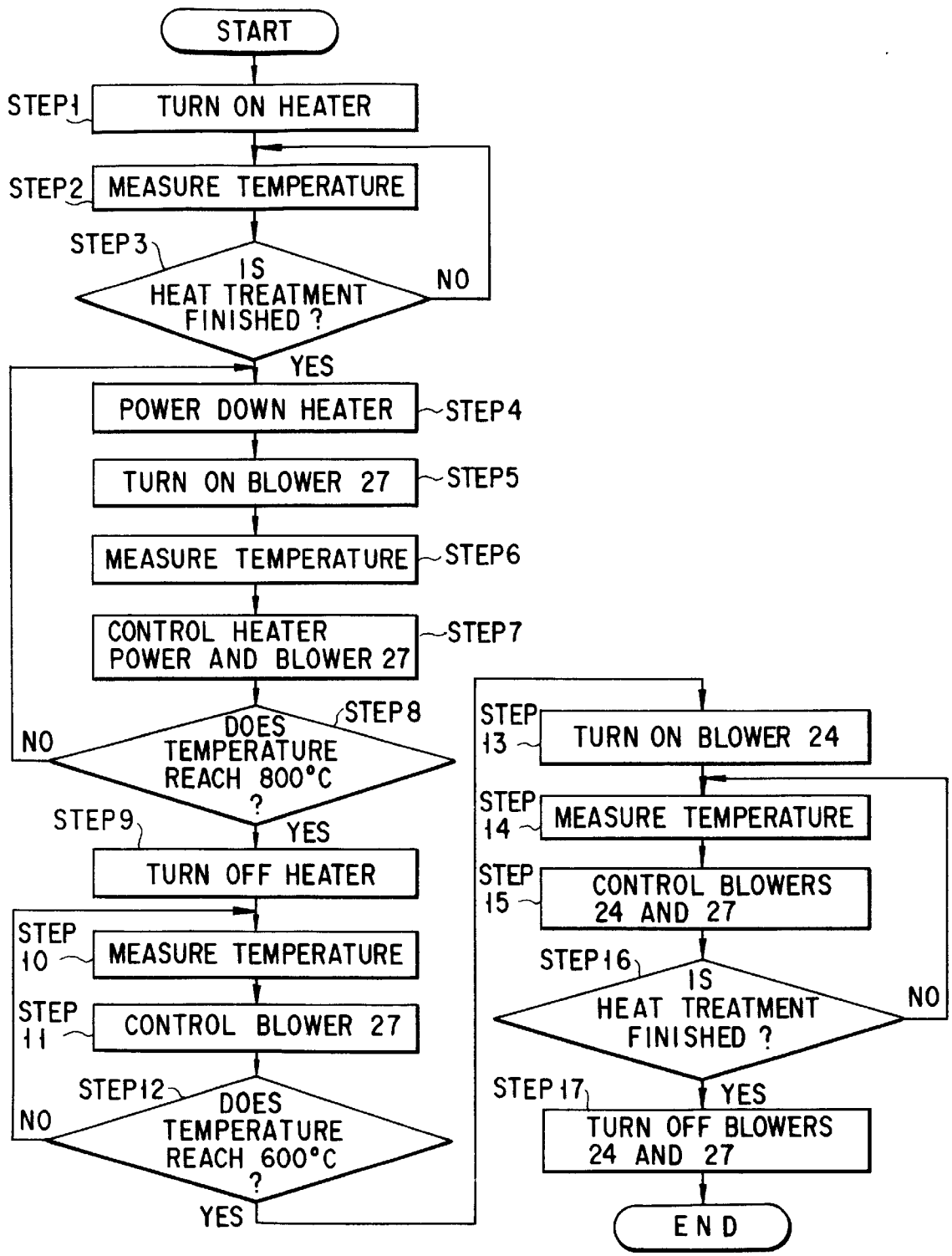
F I G. 2B

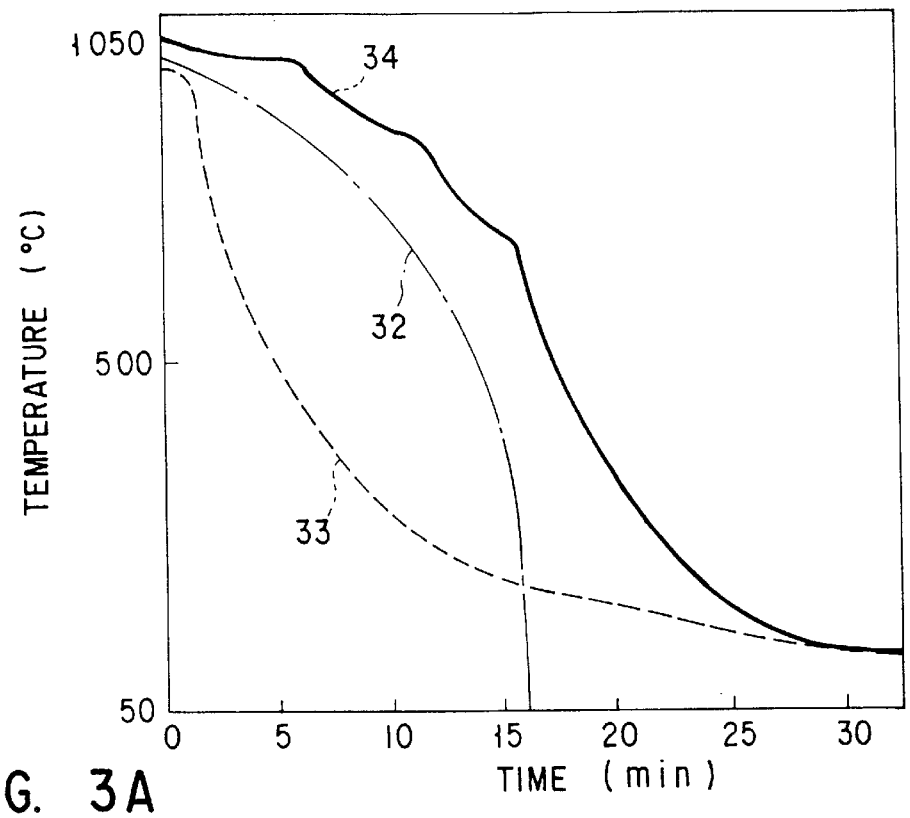
F I G. 3A
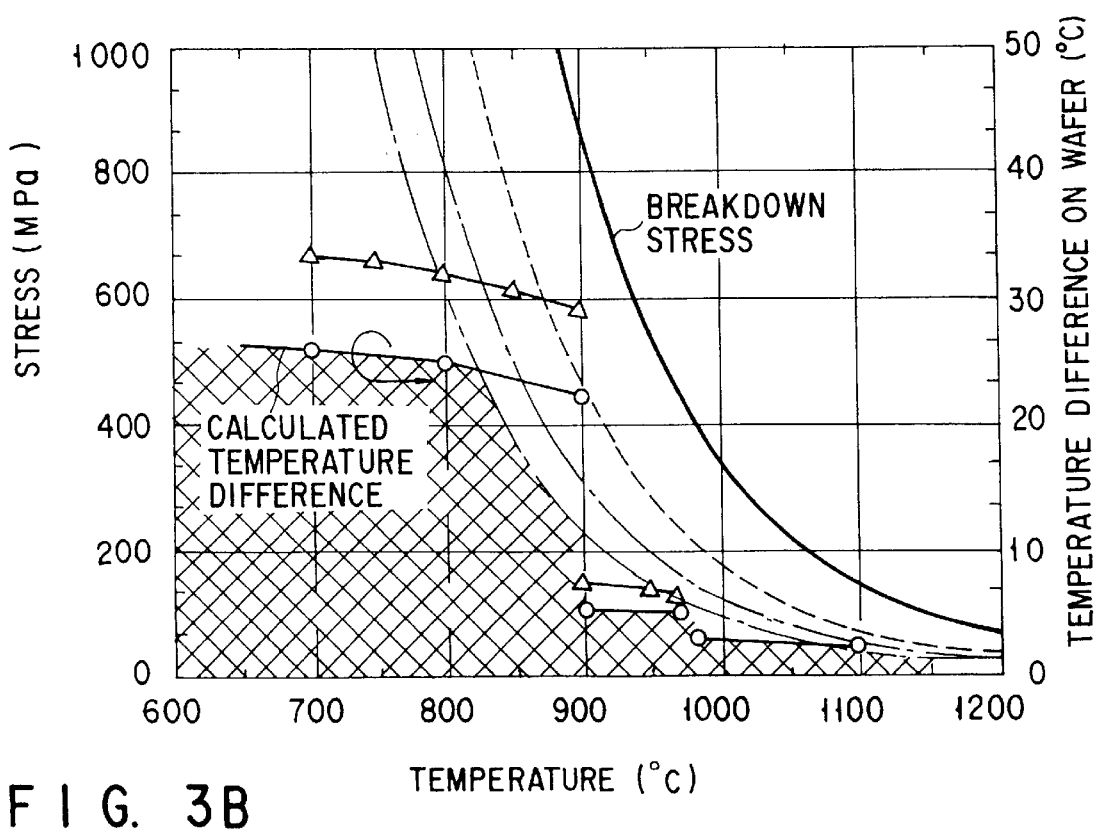
F I G. 3B

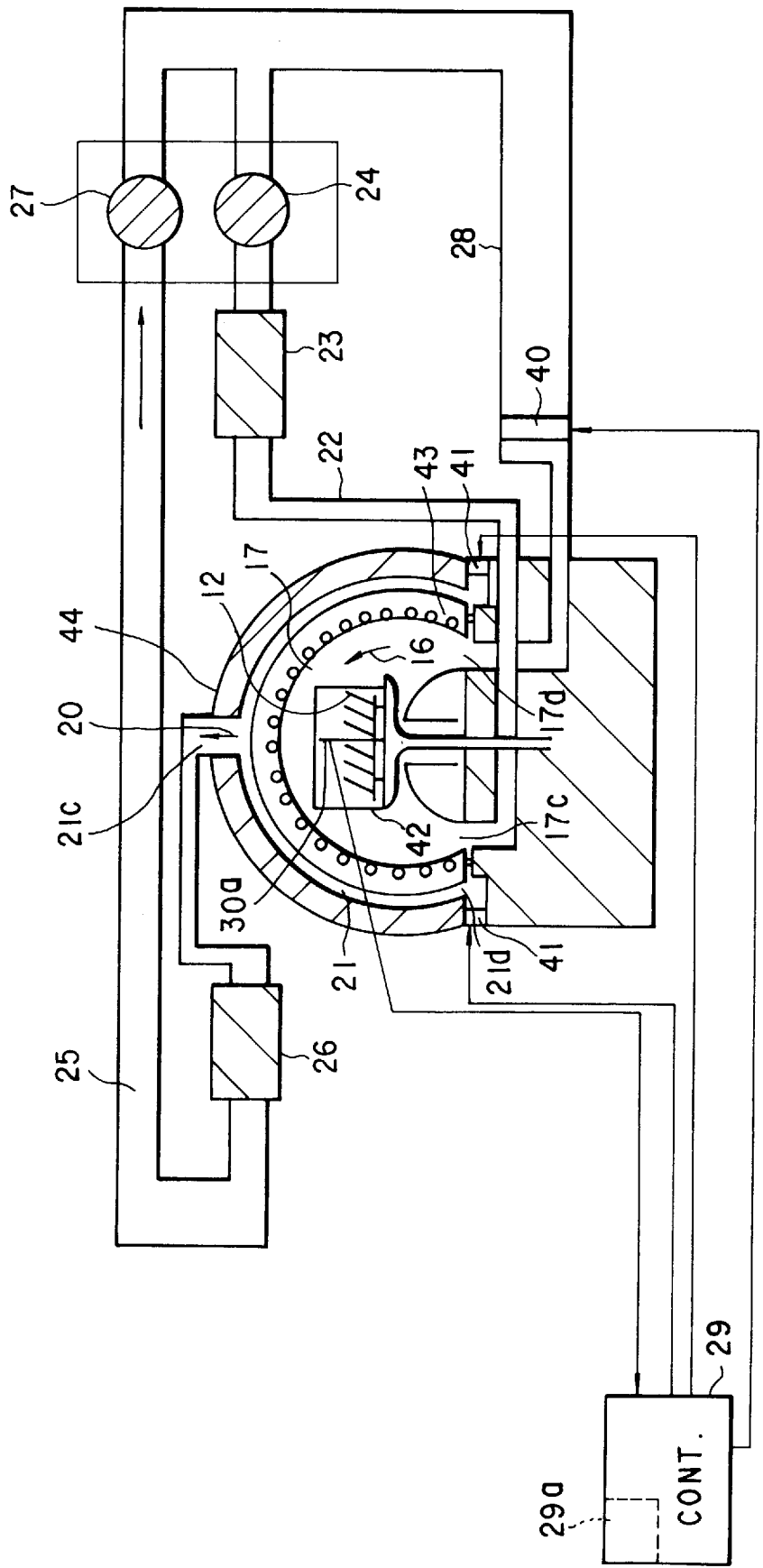
F I G. 9

5,878,191

HEAT TREATMENT APPARATUS FOR SEMICONDUCTOR WAFERS

BACKGROUND OF THE INVENTION

1. Field of the Invention

The present invention relates to a heat treatment apparatus for semiconductor wafers, used in various heat treatment steps of, e.g., thermally diffusing impurities and forming a thermal oxide film, in a process of manufacturing a semiconductor device and, more specifically, to control of cooling characteristics and cooling speed of semiconductor wafers placed in a heat treatment apparatus.

2. Description of the Related Art

FIG. 1 is a view schematically showing a constitution of a prior art heat treatment apparatus for semiconductor wafers.

As shown in FIG. 1, a wafer mounting jig 3 in which a number of semiconductor wafers 2 are placed, is incorporated in a reaction tube 1, and a heater 4 is provided outside the tube 1. Between the tube 1 and heater 4, a cooling gas path 6 for allowing cooling gas to flow in the direction of arrows 5 is interposed, and one end 6a thereof is connected to a radiator 9 by a tube 7 through a blower 8. The radiator 9 is connected to the other end 6b of the gas path 6 by a second tube 10.

According to the above-described constitution of the heat treatment apparatus, the semiconductor wafers 2 are placed in the wafer mounting jig 3, and the jig 3 is housed in the reaction tube 1. The heater 4 is then turned on to heat the tube 1, and the wafers 2 are thermally treated through various steps of manufacturing semiconductor devices from the wafers.

After the heat treatment, the heater 4 is turned off and the blower 8 is operated to drop the temperature of the wafers 2. The cooling gas is forced to circulate through the gas path 6, tube 7, blower 8, radiator 9 and tube 10 in the direction of arrows 5. The gas passing through the path 6 is cooled by the radiator 9, and the cooled gas is guided again to the path 6 via the tube 10. Thus, the inner side of heater 4 and the outer side of tube 1 are cooled, as are the semiconductor wafers 2 in the tube 1.

In the prior art heat treatment apparatus shown in FIG. 1, when the wafers are cooled quickly by air blow to improve the operating efficiency of the apparatus or control the junction of elements, the capacity of blower 8, that is, the driving capacity of cooling gas is increased to improve in cooling efficiency. In this situation, however, the cooling speed can be increased within a high-temperature zone between, e.g., 800° C. and 1200° C., whereas it cannot be increased within a low-temperature zone below, e.g., 800° C.

The rate of occurrence of crystal defects, such as a slip of silicon crystal due to variations in temperature on the surface of each semiconductor wafer, is opposite to the above relationship between the cooling speed and temperature zone. Specifically, when the wafers are cooled at the same cooling speed, the composition of silicon crystal is easy to be changed because of a slip within the high-temperature zone between 800° C. and 1200° C., while a slip is difficult to occur within the low-temperature zone below 800° C. Since, in the prior art heat treatment apparatus, the cooling speed cannot be controlled appropriately within the high-temperature zone, if the cooling speed is increased, there occurs a crystal defect, such as a change in composition due to a slip on a semiconductor wafer.

Since, furthermore, the prior art apparatus is so constructed that the cooling gas flows from the bottom of the gas path 6 toward the top thereof, the cooling speed of a semiconductor wafer 2 placed on the lower portion of the reaction tube 1, is higher than that of a semiconductor wafer 2 placed on the upper portion thereof. The variations in cooling speeds of semiconductor wafers 2 in the reaction tube 1 vary characteristics of semiconductor devices obtained from the wafers, even when the semiconductor wafers 2 are thermally treated in the same lot.

SUMMARY OF THE INVENTION

A first object of the present invention is to provide a heat treatment apparatus for semiconductor wafers which is capable of controlling a cooling speed, at which a reaction chamber is cooled after heat treatment, within respective temperature zones.

A second object of the present invention is to provide a heat treatment apparatus for semiconductor wafers which is capable of uniforming a cooling speed at which a reaction chamber is cooled after heat treatment.

A third object of the present invention is to provide a heat treatment apparatus for semiconductor wafers which is difficult to cause a crystal defect on a semiconductor wafer.

To attain the above first to third objects, there is provided a heat treatment apparatus for semiconductor wafers, comprising a reaction chamber for housing the semiconductor wafers, a heater provided outside the reaction chamber, for heating the reaction chamber, a heat-insulating member provided outside the heater, for keeping a temperature of the reaction chamber, a first cooling gas path interposed between the reaction chamber and the heater, a second cooling gas path interposed between the heater and the heat-insulating member, a cooling unit for causing gas to flow through the first and second cooling gas paths to cool the reaction chamber, and a controller for controlling the heater to increase the temperature of the reaction chamber and controlling the cooling unit to decrease the temperature of the reaction chamber.

According to the above constitution of the heat treatment apparatus, the cooling speed at which the reaction chamber is cooled after heat treatment, can be controlled in each temperature zone by controlling the cooling unit. In a high-temperature zone of the reaction chamber, gas is caused to flow through the second cooling gas path to cool the semiconductor wafers. In a low-temperature zone thereof, gas is caused to flow through the first and second gas paths to increase the cooling speed. It is thus possible to reduce the rate of occurrence of crystal defects, such as a change in composition, due to a slip of silicon crystal caused by different temperatures of the surface of each semiconductor wafer.

If, furthermore, the direction in which the gas flows through the second cooling gas path is set opposite to that in which the gas flows through the first cooling gas path, the above cooling speed can be uniformed. If an isothermal spherical reaction chamber and spherical heater and heat-insulating member are employed, the cooling speed can also be uniformed. Consequently, the above-described rate of occurrence of crystal defects can be decreased.

BRIEF DESCRIPTION OF THE DRAWINGS

FIG. 2A is a schematic view of a constitution of a heat treatment apparatus according to a first embodiment of the present invention;

FIG. 2B is a flowchart for explaining an operation of the heat treatment apparatus shown in FIG. 2A;

FIG. 3A is a diagram of both the cooling characteristics of the prior art and the present invention, and the boundary of the cooling characteristics, on which the composition of a semiconductor wafer is changed by a slip thereon;

FIG. 3B is a diagram of the relationship between the temperature of a reaction chamber and the difference in surface temperature of a semiconductor wafer, and the relationship between the temperature of the chamber and the stress applied to the wafer;

FIG. 9 is a schematic view of a heat treatment apparatus for semiconductor wafers according to a seventh embodiment of the present invention.

DETAILED DESCRIPTION OF THE PREFERRED EMBODIMENTS

Figure 1:
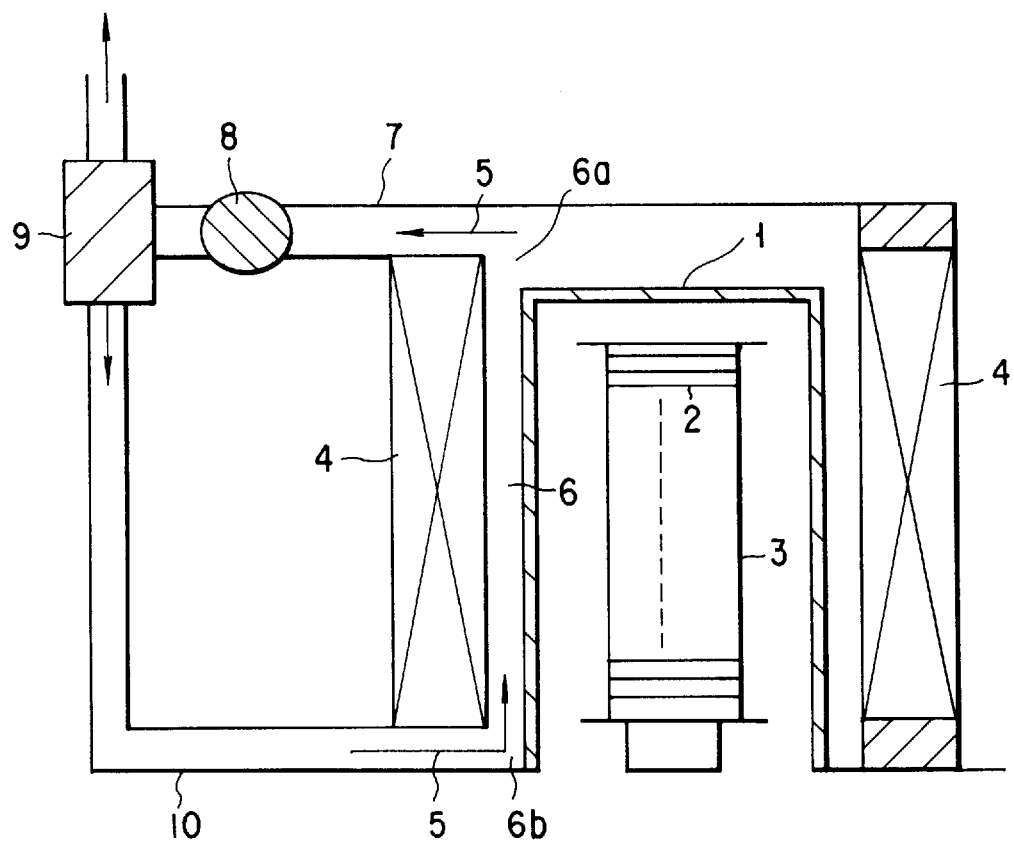
FIG. 1 is a schematic view of a constitution of a prior art heat treatment apparatus for semiconductor wafers.

FIG. 2A schematically shows a constitution of a heat treatment apparatus for semiconductor wafers according to a first embodiment of the present invention, and FIG. 2B is a flowchart for explaining an operation of the apparatus shown in FIG. 2A. As shown in FIG. 2A, a wafer mounting table 13 on which a number of semiconductor wafers 12 are mounted, is housed in a reaction tube 11 formed of quartz, SiC, etc., and a soaking tube 14 is provided outside the tube 11. A heater 15 is provided so as to cover the soaking tube 14, and a first cooling gas path 17 for allowing cooling gas to flow in the direction of arrows 16 is interposed between the tube 14 and heater 15. A heat-insulating cloth 18 is provided under the heater 15. Heat-insulating members 19 are arranged above the tube 14 and outside the heater 15, respectively, and a second cooling gas path 21 for allowing cooling gas to flow in the direction of arrow 20 is interposed between the heater 15 and heat-insulating member 15.

One end 17a of the first path 17 is connected to a first blower 24 by a first tube 22 through a first radiator 23. While one end 21a of the second path 21 is connected to a second blower 27 by a second tube 25 through a second radiator 26, the other end 21b thereof is connected to the first and second blowers 24 and 27 by a third tube 28. These first and second blowers 24 and 27 are electrically connected to a controller 29 to control their operations by signals output therefrom. A thermocouple 30a is inserted in the reaction tube 11 to measure the temperature of the tube 11, and first to fourth thermocouples 30b to 30e are inserted in the first cooling gas path 17 at different locations to measure the temperature of the path 17. The results of temperature measurement of these thermocouples 30a to 30e are supplied to the controller 29. The controller 29 includes a storage section 29a in which data of cooling characteristics (described later) is stored. The cooling characteristics indicate the relationship between the cooling time required for cooling the reaction tube 11 and the temperature of the tube 11 measured by the thermocouple 30a.

In the heat treatment apparatus having the above constitution, first a number of wafers 12 are mounted on the wafer mounting table 13, and then the table 13 is inserted in the reaction tube 11. After that, as shown in the flowchart of FIG. 2B, the heater 15 is turned on (step 1) to heat the tube 11, and the wafers 12 are thermally treated at a required temperature (e.g., 1000° C. or higher) for a required time to execute various steps of manufacturing semiconductor devices from the wafers 12. In this heat treatment, the temperature of the tube 11 is measured by the thermocouple 30a and those of the heater 15 at its different locations are done by the thermocouples 30b to 30e (step 2). These measured temperatures are compared with data stored in advance in the storage section 29a of the controller 29 to determine whether the heat treatment is completed or not (step 3). If the measured temperature does not reach the data (heat treatment time and temperature) stored in the section 29a, the flow returns to the step 2, and the heat treatment continues. If the temperature coincides with the data, it is determined that the heat treatment is completed. Consequently, the heat treatment can be performed, while the time and temperature are being managed.

If it is determined that the heat treatment is completed in accordance with the data of time and temperature stored in the storage section 29a, the temperature of the wafers 12 is dropped. In this case, the controller 29 controls the heater 15 and blowers 24 and 27 using a cascade control system in which PID (proportional integral and differential) control is performed for the temperature measurement results of the thermocouples 30a to 30e. More specifically, the power supplied to the heater 15 is reduced, or the effective power is decreased by intermittently applying a power supply voltage to the heater 15 (step 4) to operate the second blower 27 to force cooling gaseous nitrogen ($N_2$ gas) to flow through the second cooling gas path 21 in the direction of arrow 20 (step 5). The $N_2$ gas is then cooled by the second radiator 26, and the cooled gas is guided again to the second path 21 via the second and third tubes 25 and 28. This operation is repeated in the same manner, and the $N_2$ gas is circulated to drop the temperature of the reaction tube 11. The temperature of the tube 11 is measured by the thermocouple 30a and those of the heater 15 is measured by the thermocouples 30b to 30e (step 6). These measured temperatures are compared with the data stored in advance in the storage section 29a to control the power applied to the heater 15 and the operation of the blower 27, thereby decreasing the temperature of the reaction tube 11 while managing the speed at which the temperature is decreased (step 7).

The outer side of heater 15 and the inner sides of heat-insulating members 19 are cooled to lower the temperature of the tube 11 to about 600° C. to 700° C. When it is detected that the temperature of the tube 11 falls within a zone between 600° C. and 800° C. (step 8, 800° C. in the example of FIG. 2B), the heater 15 is turned off (step 9). The cooling speed is then controlled by the controller 29 and set to a value (indicated by solid line 34 in FIG. 3A) which is stored in the storage section 29a and inhibits a defect from being caused by a slip or the like on silicon crystal of the semiconductor wafers 12. In other words, in order to obtain the value, the controller 29 controls the ON/OFF state of the second blower 27 based on temperature information measured by the thermocouple 30a.

After the heater 15 is turned off, it is detected that the temperature of the reaction tube 11 is decreased to about 600° C. to 700° C. by the thermocouple 30 (step 12, 600° C. in the example of FIG. 2B), the first blower 24 is operated (step 13) to force the $N_2$ gas to flow through the first cooling gas path 17 in the direction of arrows 16. The $N_2$ gas is then cooled by the first radiator 23 and guided again to the gas path 17. Consequently, the $N_2$ gas flows through both the first and second paths 17 and 21, and the cooling speed increases in the reaction tube 11. The higher the cooling speed, the greater the temperature difference on the semiconductor wafer 12. If, however, the temperature of the periphery of the wafer 12 is low, no crystal defects occur, irrespective of the temperature difference.

When the temperature of the reaction tube 11 falls within a zone between 600° C. and 700° C., the cooling speed is controlled by the controller 29 to have a value stored in the storage section 29a and indicated by solid line 34 in FIG. 3A. In the controller 29, the temperature of the tube 11 is measured (step 14) by the thermocouple 30a (step 14), and the ON/OFF states of the first and second blowers 24 and 27 are controlled on the basis of the measured temperature, thereby controlling the speed at which the temperature of the tube 11 is decreased (step 15). When it is detected that the temperature of the tube 11 is sufficiently decreased (step 16), the first and second blowers 24 and 27 are turned off, and the heat treatment is completed accordingly (step 17).

FIG. 3A shows cooling characteristics of both the prior art heat treatment apparatus and that of the present invention, and a boundary of the cooling characteristics on which the composition of a semiconductor wafer is changed by a slip or the like. The slip is caused by the difference in temperature between the central and peripheral portions of the semiconductor wafer. In FIG. 3A, one-dot-one-dash line 32 indicates the relationship between the cooling time and temperature of reaction tube 11, which represents the boundary of cooling characteristics of causing a crystal defect due to a slip. This boundary is obtained by estimating differences in temperature between the peripheral and central portions of respective wafers by simulation when a slip occurs. Broken line 33 shows the relationship between the cooling time required for cooling the wafers and the temperature of the reaction tube measured by the thermocouple in the prior art heat treatment apparatus. Solid line 34 shows an example of cooling characteristics of allowing the boundary 32 to have a slip-free margin, that is, data input to the storage section 29a of the controller 29.

It is apparent from FIG. 3A that the composition of a semiconductor wafer is changed by a slip or the like in the cooling characteristics of the prior art heat treatment apparatus and that no crystal defects, such as a change in composition, due to a slip occur in those of the present invention.

The solid line 34 indicates a mere example of the cooling characteristics of the heat treatment apparatus of the present invention. In FIG. 3A, the cooling characteristics fall within the range on the right of the one-dot-one-dash line 32, no crystal defects due to a slip occur on a semiconductor wafer.

FIG. 3B is a graph for explaining in detail the data stored in the storage section 29a of the controller 29, and shows the relationship between the temperature of the reaction tube and the difference in surface temperature of a semiconductor wafer and the relationship between the temperature of the tube and the stress applied to the wafer. In FIG. 3B, a slip-free zone is crosshatched and its data is stored in the storage section 29a. The controller 29 controls the heater 15 and blowers 24 and 27 such that the foregoing stress and surface temperature difference fall within the crosshatched zone.

According to the first embodiment described above, the ON/OFF states of heater 15 and first and second blowers 24 and 27 are controlled by the controller 29. In the high-temperature zone of the reaction tube 11, the second blower 27 causes the cooling $N_2$ gas only through the second cooling gas path 21 while controlling the flow rate of the gas, so that the semiconductor wafers 12 can be cooled on the condition indicated by solid line 34 in FIG. 3. In other words, based on data of cooling speed stored in the storage section 29a and data of temperatures measured by the thermocouples 30a to 30e, the semiconductor wafers 12 can be cooled at a suitable cooling speed which causes no crystal defects such as a change in composition due to a slip. Since the wafers are cooled using the first and second cooling gas paths 17 and 21 after the reaction tube 11 is decreased in temperature, the cooling speed, especially in a zone below 800° C., can be made higher than that of the prior art heat treatment apparatus.

In the first embodiment described above, the $N_2$ gas flows through the first and second paths 17 and 21. However, it can be replaced with another inert gas or air.

Figure 4:
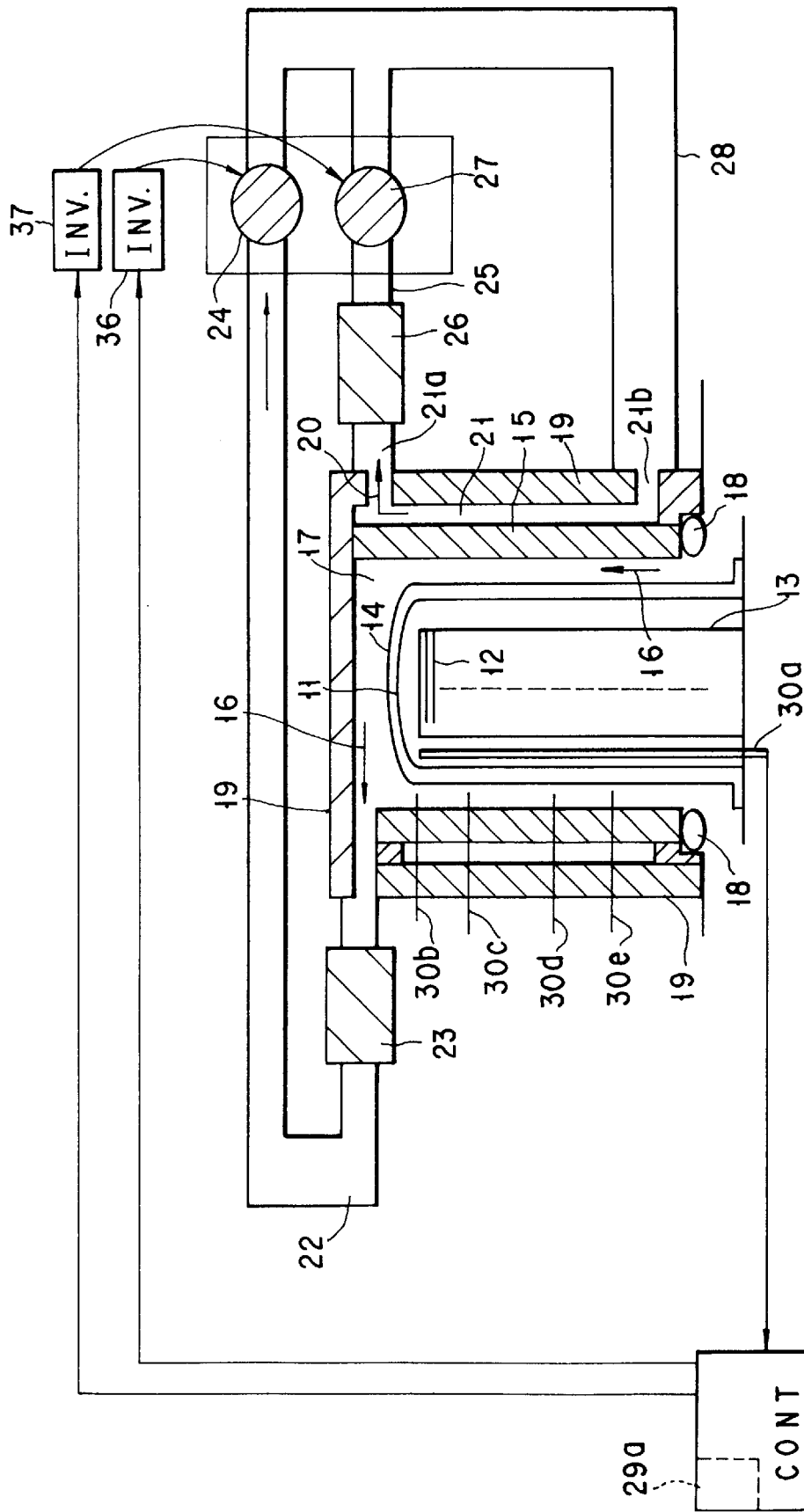
FIG. 4 is a schematic view of a heat treatment apparatus for semiconductor wafers according to a second embodiment of the present invention.

FIG. 4 is a schematic view of a heat treatment apparatus for semiconductor wafers according to a second embodiment of the present invention. In FIG. 4, the same structural elements as those of FIG. 2A are denoted by the same reference numerals and their descriptions are omitted.

The heat treatment apparatus shown in FIG. 4 includes first and second inverters 36 and 37. These inverters are controlled in response to signals output from the controller 29 to intermittently drive the blowers 24 and 27 and change a cycle of On- and OFF states of the blowers, thus controlling the flow rate of the $N_2$ gas.

According to the heat treatment apparatus of the second embodiment, the controller 29 controls the second inverter 37 and the inverter 37 does the cycle of ON/OFF states of the second blower, in order to make the cooling speed at which the temperature of semiconductor wafers 12 is dropped to about 600° C. to 700° C. after the heat treatment, coincident with the characteristics (speed) indicated by solid line 34 in FIG. 3.

To make the cooling speed at which the semiconductor wafers 12 are cooled further, coincident with the speed indicated by solid line 34 in FIG. 3, the controller 29 controls the first and second inverters 36 and 37 to change the cycles of the first and second blowers 24 and 27 and thus control the flow rate of the $N_2$ gas.

The second embodiment also creates the same advantage as that of the first embodiment. Since, in the second embodiment, the flow rate of $N_2$ gas is controlled by changing the cycles of ON/OFF states of the blowers 24 and 27, the temperature can be controlled more accurately than in the apparatus shown in FIG. 2A.

Figure 5:
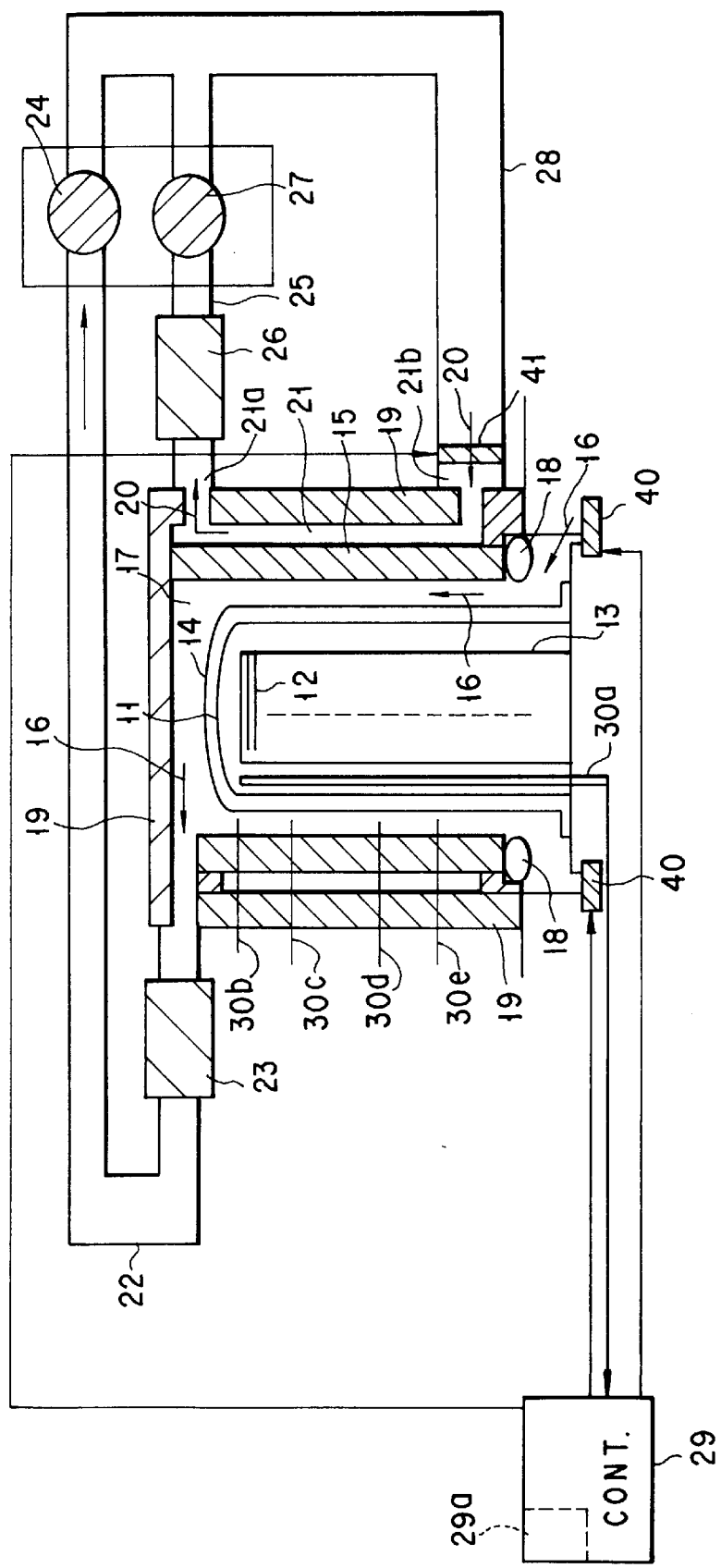
FIG. 5 is a schematic view of a heat treatment apparatus for semiconductor wafers according to a third embodiment of the present invention.

FIG. 5 is a schematic view of a heat treatment apparatus for semiconductor wafers according to a third embodiment of the present invention. In FIG. 5, the same structural elements as those of FIG. 2A are denoted by the same reference numerals and their descriptions are omitted.

As illustrated in FIG. 5, a first shutter 40 is provided under the first cooling gas path 17, and a second shutter 41 is provided at the other end 21b of the second cooling gas path 21. These first and second shutters 40 and 41 are opened and closed in response to signals output from the controller 29.

In the heat treatment apparatus of the third embodiment, when the semiconductor wafers 12 decrease in temperature after heat treatment, the first shutter 40 is closed and the second shutter is opened, and the first and second blowers 24 and 27 are operated. Thus the $N_2$ gas is caused to flow through the second cooling gas path 21 and accordingly the reaction tube 11 is cooled to a temperature ranging from about 600° C. to 700° C. In order that the cooling speed may reach the one indicated by the solid line 34 in FIG. 3, the controller 29 controls the opening/closing of the second shutter 41 based on temperature information measured by the thermocouple 30a.

If the first shutter 40 is opened, the $N_2$ gas is allowed to flow through the first cooling gas path 17. To cool the reaction tube 11 further by the $N_2$ gas, the cooling speed has to reach the one indicated by the solid line 34 in FIG. 3. To do so, the controller 29 controls the opening/closing of the first and second shutters 40 and 41 based on the temperature information measured by the thermocouple 30a.

The third embodiment differs from the first embodiment only in that the shutters 40 and 41 are used in place of the blowers 24 and 27 to control their opening and closing to allow the $N_2$ gas to flow. Therefore, the same advantage as that of the first embodiment can be obtained from the third embodiment.

Figure 6:
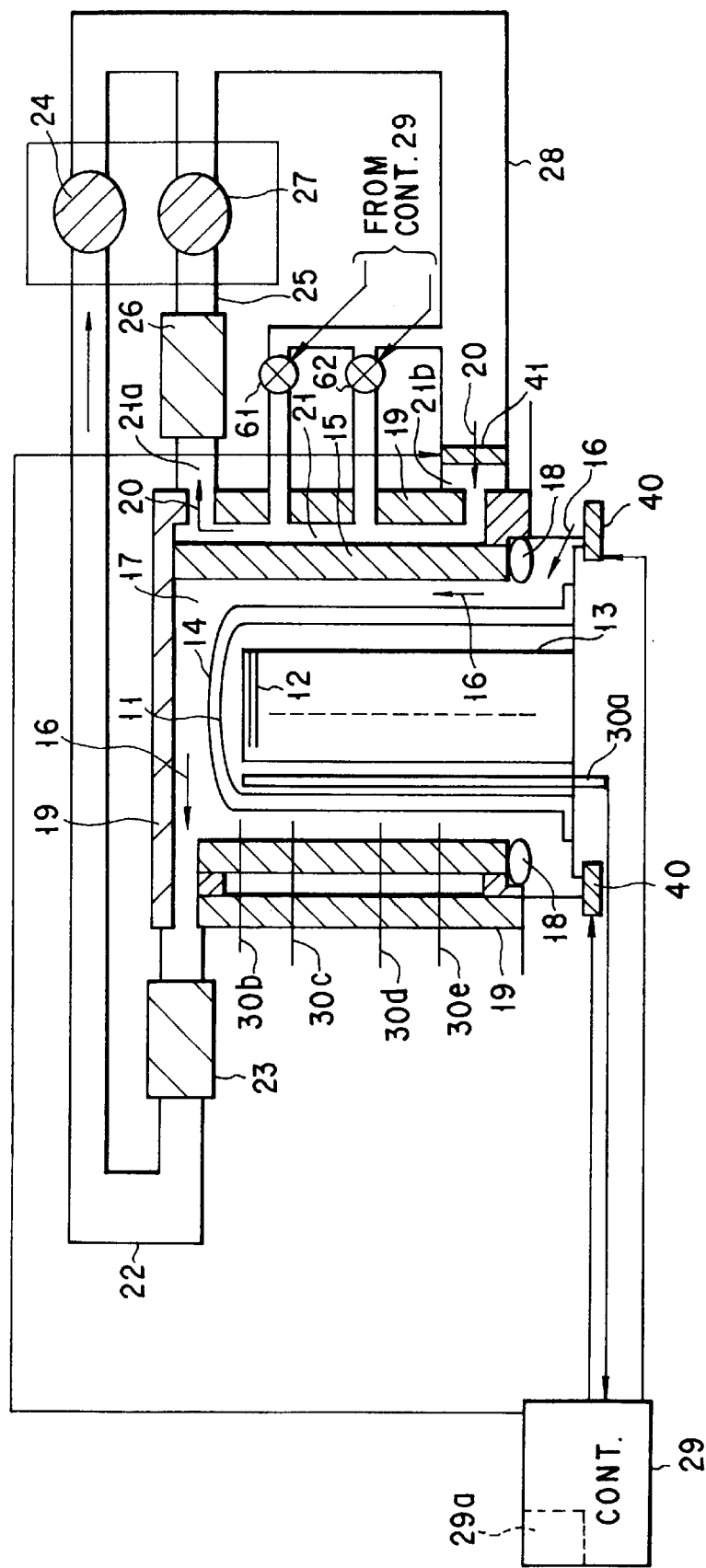
FIG. 6 is a schematic view of a heat treatment apparatus for semiconductor wafers according to a fourth embodiment of the present invention.

FIG. 6 is a schematic view of a heat treatment apparatus for semiconductor wafers according to a fourth embodiment of the present invention. In FIG. 6, the same structural elements as those of FIG. 5 are denoted by the same reference numerals and their descriptions are omitted.

In the heat treatment apparatus of the fourth embodiment, gas flow rate control valves 61 and 62 are added to the apparatus of the third embodiment to allow $N_2$ gas to be supplied from the tube 28 to the cooling gas path 21 through the valves. The amount of opening/closing of the valves 61 and 62 is controlled by the controller 29, and the $N_2$ gas is guided to the gas path 21 through plural routes.

Therefore, the semiconductor wafers can be cooled uniformly, regardless of the positions of the wafers 12 on the wafer mounting table 13, that is, regardless of whether the wafers are mounted at the bottom portion of the table 13, which is close to the shutter 41 from which the $N_2$ gas introduced, or at the top portion of the table 13. Furthermore, the temperatures of the reaction tube 11 are measured by the thermocouples 30b to 30e, and the opening/closing of the shutter 41 is controlled in accordance with the distribution of the measured temperatures, as is the amount of opening/closing of the valves 61 and 62. It is thus possible to uniform the distribution of the temperatures of the tube 11 and cool the semiconductor wafers 12 therein.

Figure 7:
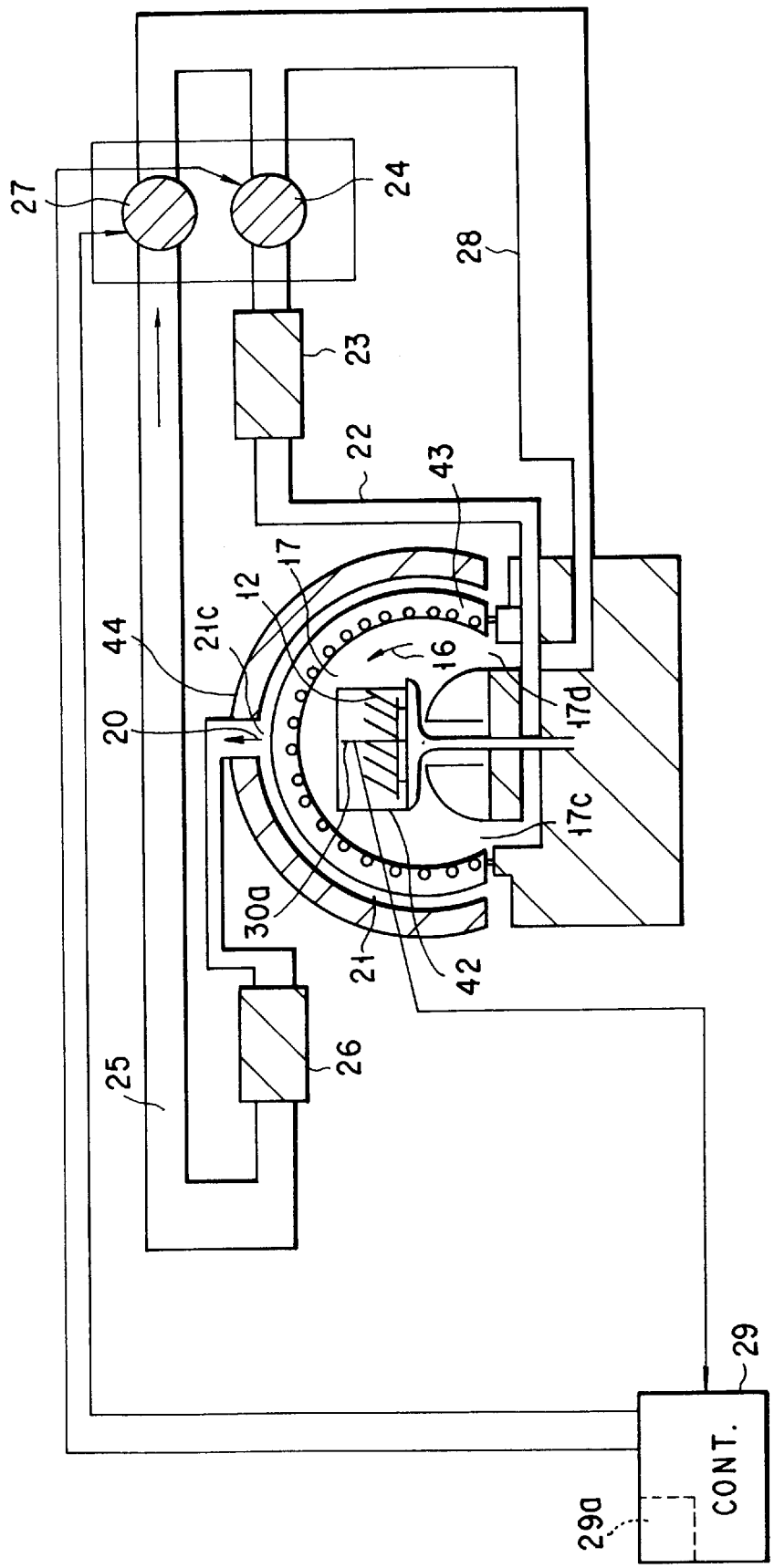
FIG. 7 is a schematic view of a heat treatment apparatus for semiconductor wafers according to a fifth embodiment of the present invention.

FIG. 7 is a schematic view of a heat treatment apparatus for semiconductor wafers according to a fifth embodiment of the present invention. In FIG. 7, the same structural elements as those of FIG. 2A are denoted by the same reference numerals and their descriptions are omitted.

In the apparatus of the fifth embodiment, an isothermal spherical reaction chamber 42 is used in place of the reaction tube of the first to fourth embodiments. A number of semiconductor wafers 12 are housed in the chamber 42, and a spherical heater 43 is provided so as to cover the reaction chamber 42. A first cooling gas path 17 through which cooling gas flows in the direction of arrow 16, is interposed between the chamber 42 and heater 43. A spherical heat-insulating member 44 is formed outside the heater 43, and a second cooling gas path 21 through which the cooling gas flows in the direction of arrow 20, is interposed between the heater 43 and heat-insulating member 44.

While a vent 17c of the first cooling gas path 17 is connected to the first blower 24 by the first tube 22 via the first radiator 23, a vent 21c of the second cooling gas path 21 is connected to the second blower 27 by the second tube 25 via the second radiator 26. An intake 17d of the gas path 17 is connected to the first and second blowers 24 and 27 by the third tube 28. Since the distribution of temperatures in the reaction chamber 42 can be uniformed in virtue of the reaction chamber 42, no thermocouples for temperature measurement have to be arranged in the first cooling gas path 17, and the thermocouple 30a is provided only in the vicinity of the semiconductor wafers 12 in the reaction chamber 42.

According to the heat treatment apparatus of the fifth embodiment, the semiconductor wafers 12 housed in the reaction chamber 42 are heated by the heater 43 on the conditions of temperature and time required in heat treatment steps.

In order to drop the temperature of the semiconductor wafers 12 after the heat treatment, the second blower 27 is operated to allow the cooling $N_2$ gas to flow through the second path 21. The $N_2$ gas is then cooled by the radiator 26, with the result that the outer surface of the heater 43 and the inner surface of the heat-insulating member 44 are cooled, and the reaction chamber 42 is cooled to about 600° C. to 700° C. To cool the chamber 42, the cooling speed has to reach the one indicated by solid line 34 in FIG. 3. To do so, the temperatures of the reaction chamber are measured by the thermocouple 30a, and the ON/OFF states of heater 43 and second blower 27 are controlled by the controller 29.

If the first blower 24 is operated, the $N_2$ gas is caused to flow through the first path 17 in the direction of arrow 16. The $N_2$ gas is cooled by the first radiator 23, and the cooled gas is guided again to the first path 17 via the third tube 28. As a result, the $N_2$ gas flows through both the first and second paths 17 and 21, and the cooling speed increases in the reaction tube 11.

The fifth embodiment also creates the same advantage as that of the first embodiment described above. In the fifth embodiment, the use of isothermal spherical reaction chamber 42, spherical heater 43 and spherical heat-insulating member 44 decreases in space and lot and saves energy. More specifically, since the apparatus of the fifth embodiment is more compact than a tube type diffusion furnace and requires no extra soaking zone, energy can be saved, a space can be reduced, and a single thermocouple suffices to measure the temperature of reaction chamber 42, with the result that the cost of the apparatus including the control system can be lowered. Both the speeds at which the temperatures of semiconductor wafers are increased and decreased, can be controlled, and the temperatures can be increased at high speed without causing any slip on the wafers.

Figure 8:
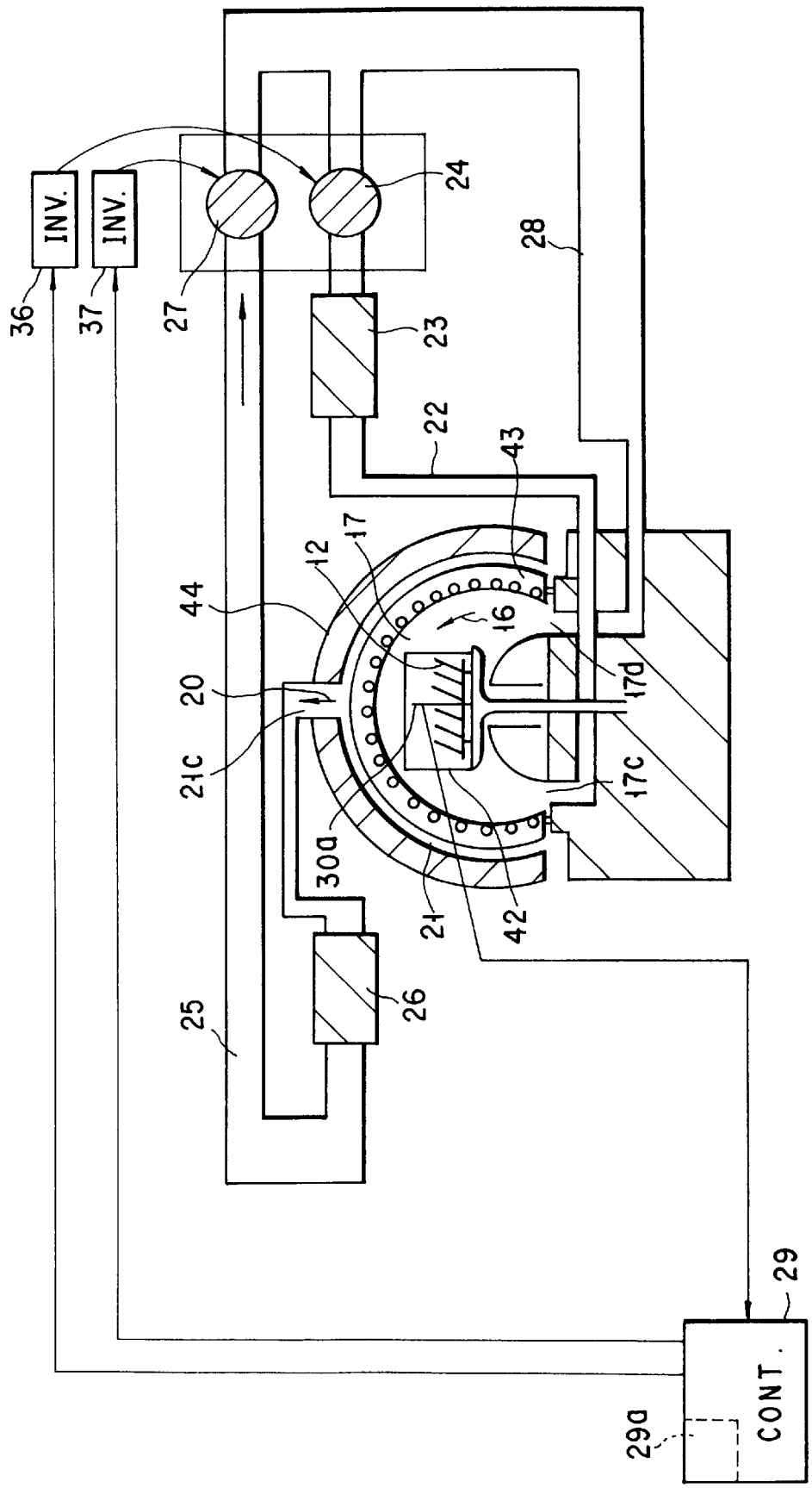
FIG. 8 is a schematic view of a heat treatment apparatus for semiconductor wafers according to a sixth embodiment of the present invention.

FIG. 8 is a schematic view of a heat treatment apparatus for semiconductor wafers according to a sixth embodiment of the present invention. In FIG. 8, the same structural elements as those of FIG. 7 are denoted by the same reference numerals and their descriptions are omitted.

The apparatus of the sixth embodiment includes first and second inverters 36 and 37 as that of the second embodiment does. These inverters 36 and 37 are controlled in response to a signal output from the controller 29 to intermittently drive the blowers 24 and 27. Thus, the cycle of ON/OFF states of blowers 24 and 27 is varied to control the flow rate of $N_2$ gas.

According to the above constitution of the apparatus shown in FIG. 8, in order to decrease the temperature of semiconductor wafers 12 down to about 600° C. to 700° C. after heat treatment, the cooling speed has to reach the one indicated by solid line 34 in FIG. 3. To do so, the controller 29 controls the cycle of ON/OFF of first and second inverters 36 and 37, thereby controlling the first and second blowers 24 and 27.

The sixth embodiment also creates the same advantage as that of the fifth embodiment described above. Since, in the sixth embodiment, the flow rate of $N_2$ gas is controlled by varying the cycle of ON/OFF states of the blowers 24 and 27, the temperature of wafers can be controlled more finely than in the apparatus shown in FIG. 2A.

FIG. 9 is a schematic view of a heat treatment apparatus for semiconductor wafers according to a seventh embodiment of the present invention. In FIG. 9, the same structural elements as those of FIG. 7 are denoted by the same reference numerals and their descriptions are omitted.

In the heat treatment apparatus shown in FIG. 9, the first and second blowers 24 and 27 are connected to an intake 17d of the first cooling gas path 17 by the third tube 28. A first shutter 40 is provided at the intake 17d of the first path 17, while a second shutter 41 is provided at an intake 21d of the second cooling gas path 21. The opening/closing of the first and second shutters 40 and 41 is controlled in response to an output signals of the controller 29.

According to the constitution of the apparatus shown in FIG. 9, when the temperature of semiconductor wafers 12 is decreased, the first shutter 40 is closed and the second shutter 41 is opened to operate the first and second blowers 24 and 27, with the result that the cooling $N_2$ gas flows through the second cooling gas path 21 and is then cooled by the radiator 26. The isothermal spherical reaction chamber 42 is thus cooled to about 600° C. to 700° C. The speed at which the chamber 42 is cooled, is controlled so as to reach the one indicated by solid line 34 in FIG. 3. To do so, the controller 29 controls the opening/closing of the second shutter 41 on the basis of temperature information measured by the thermocouple 30a and data stored in the storage section 29a.

After that, if the first shutter 40 is opened, the cooling $N_2$ gas is caused to flow through the first gas path 17, and the cooling speed is accelerated. To cool the reaction chamber 42 further by the $N_2$ gas, the cooling speed has to reach the one indicated by the solid line 34 in FIG. 3. To do so, the controller 29 controls the opening/closing of the first and second shutters 40 and 41 based on the temperature information measured by the thermocouple 30a.

In the seventh embodiment, too, the same advantage as that of the sixth embodiment can be obtained.

Figure 10:
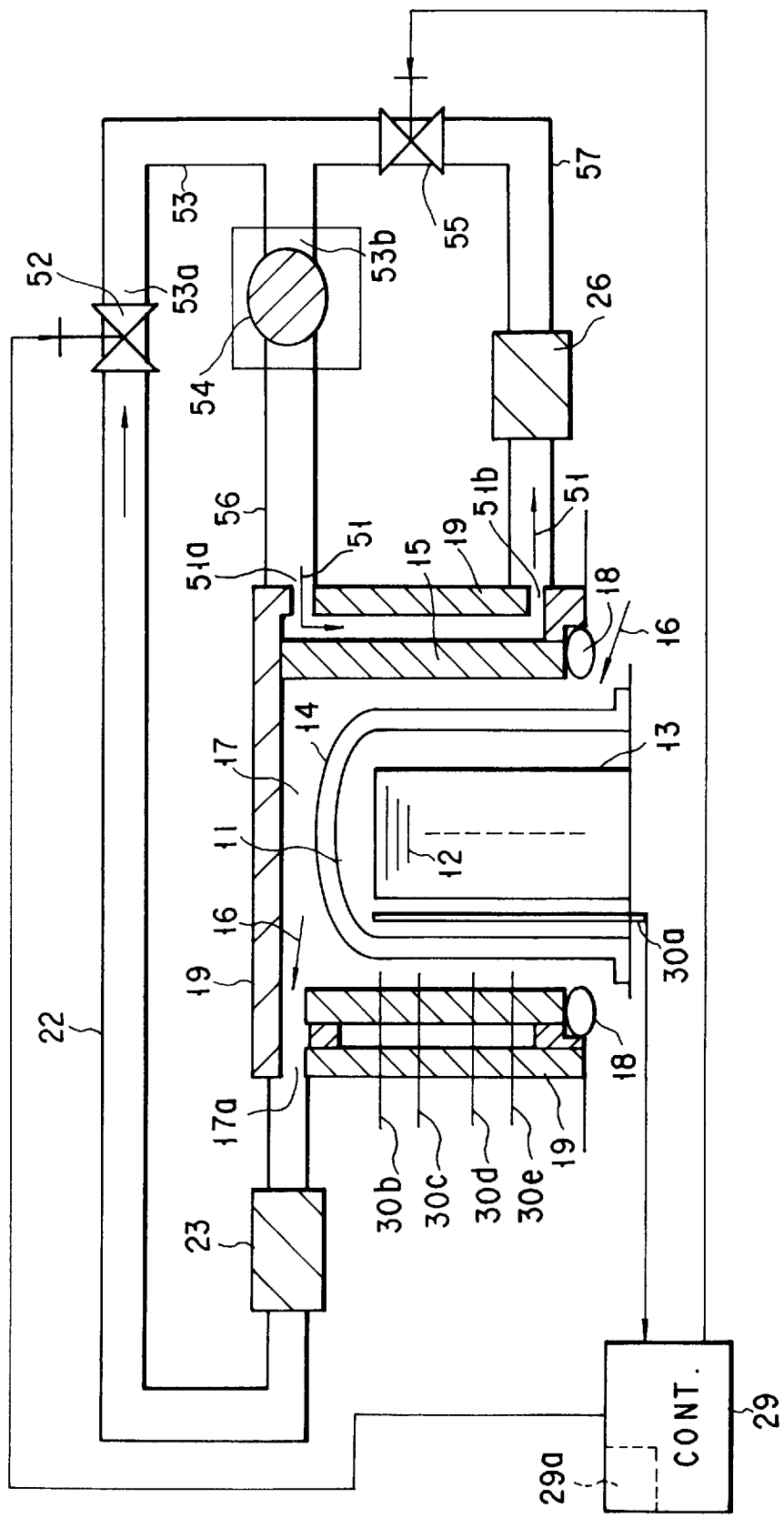
FIG. 10 is a schematic view of a heat treatment apparatus for semiconductor wafers according to an eighth second embodiment of the present invention.

FIG. 10 is a schematic view of a heat treatment apparatus for semiconductor wafers according to an eighth embodiment of the present invention. In FIG. 10, the same structural elements as those of FIG. 2A are denoted by the same reference numerals and their descriptions are omitted.

As illustrated in FIG. 10, a second cooling gas path 21 is arranged between the heater 15 and heat-insulating members 19 in order to allow cooling gas to flow in the direction of arrows 51.

One end 17a of the first cooling gas path 17 is connected to one side of a first valve 52 for controlling the flow rate of gas, by the first tube 22 through the first radiator 23, and the other side of the valve 52 is connected to a first end 53a of a second tube 53. A second end 53b of the second tube 53 is connected to a blower 54, and a third end 53c thereof is connected to one side of a second valve 55 for controlling the flow rate of gas.

While one end 21a of the second cooling gas path 21 is connected to the blower 54 by the third tube 56, the other end 21b thereof is connected to the other side of the second valve 55 by a fourth tube 57 via the second radiator 26.

In the heat treatment apparatus shown in FIG. 10, when the temperature of semiconductor wafers 12 is lowered after heat treatment, the valves 52 and 55 are opened to operate the blower 54, thus causing the $N_2$ gas to flow through the cooling gas paths 17 and 21. The $N_2$ gas passing through the path 17 is cooled by the first radiator 23, and the cooled gas is guided to the second path 21 through the first to third tubes 22, 53 and 56. The $N_2$ gas passing through the second path 21 is cooled by the second radiator 26, and the cooled gas is guided again to the second path 21. When the semiconductor wafers 12 are decreased in temperature, the temperature of each zone of the reaction tube is monitored by first to fourth thermocouples 30b to 30e. The flow rate of $N_2$ gas is controlled by the valves 52 and 55 so as to uniform the temperature-decreasing speed in the respective zones.

According to the eighth embodiment, the direction in which the $N_2$ gas flows through the second path 21, is opposite to that in which the gas flows through the first path 17. Thus, the variations in temperature-decreasing speed in the respective zones of the reaction tube 11 can be eliminated, or the temperature-decreasing speeds in the zones can be uniformed. If the direction in which the $N_2$ gas flows through the second path 21 is the same as that in which the gas flows through the first path 17, the cooling speeds measured by the first to fourth thermocouples 30b to 30e are as follows, while the reaction tube is cooled to 640° C. to 300° C.

The cooling speed measured by the first thermocouple 30b is 39.1° C./min, those measured by the second and third thermocouples 30c and 30d are each 42.6° C./min, and that measured by the fourth thermocouple 30e is 78.3° C./min.

In contrast, when the cooling gas $N_2$ flows in the direction as in the eighth embodiment, the cooling speeds measured by the first to fourth thermocouples 30b to 30e are uniformed. It is thus possible to prevent variations in characteristics between semiconductor wafers, which are caused by variations in cooling speeds of respective zones of a reaction tube.

The cooling speed at which the tube 11 is cooled, can be made higher than that in the prior art heat treatment apparatus. The reason is as follows. In the above eighth embodiment, the cooling gas is caused to flow through the first and second cooling gas paths 17 and 21, whereas in the prior art apparatus, the cooling gas is caused to flow only through a path corresponding to the first path 17 of the eighth embodiment of the present invention.

Since, furthermore, the first and second valves 52 and 55 are used, one blower 54 is sufficient. In this respect, the cost of the apparatus of the eighth embodiment can be lowered, as compared with the first to seventh embodiments.

Needless to say, in the first to seventh embodiments, too, the direction in which the gas flows through the first path 17 can be set equal to that in which the gas flows through the second path 21. In the first to seventh embodiments, the second cooling gas path 21 is used to cool the wafers in the high-temperature zone. However, both the first and second cooling gas paths 17 and 21 can be used to cool the gas whose flow rate is reduced by the blowers 24 and 27. The directions in which the gas flows through the first and second paths 17 and 21, can be opposite to each other.

What is claimed is:

1. A heat treatment apparatus for semiconductor wafers, comprising:

a reaction chamber for housing the semiconductor wafers;

heating means provided outside said reaction chamber, for heating said reaction chamber;

insulating means provided outside said heating means, for keeping a temperature of said reaction chamber;

a first cooling gas path interposed between said reaction chamber and said heating means;

a second cooling gas path interposed between said heating means and said insulating means;

cooling means for cooling said reaction chamber by gas flowing through said first cooling gas path and said second cooling gas path; and control means for controlling said cooling means to flow gas through said second cooling gas path to cool the semiconductor wafers to one of a predetermined temperature and a predetermined temperature range, and then to flow gas through said first and second cooling gas paths to further cool the semiconductor wafers.

2. The heat treatment apparatus according to claim 1, wherein said reaction chamber includes a reaction tube and a soaking tube provided outside said reaction tube.

3. The heat treatment apparatus according to claim 2, wherein said apparatus further comprises temperature measuring means for measuring the temperature of said reaction chamber, and said control means controls said cooling means based on the temperature of said reaction chamber measured by said temperature measuring means and cooling characteristics stored in advance.

4. The heat treatment apparatus according to claim 3, wherein said apparatus further comprises a plurality of temperature measuring means for measuring a temperature of the gas flowing through said first cooling gas path, and said control means controls based on the temperature of said reaction chamber measured by said temperature measuring means, the temperature of the gas measured by said plurality of temperature measuring means, and the cooling characteristics stored in advance.

5. The heat treatment apparatus according to claim 2, wherein said heating means is provided so as to cover the soaking tube and includes a heater which is turned on/off by said control means.

6. The heat treatment apparatus according to claim 5, wherein said insulating means includes a heat-insulating member provided outside the heater and above the soaking tube.

7. The heat treatment apparatus according to claim 5, wherein said first cooling gas path is provided between the heater and the soaking tube.

8. The heat treatment apparatus according to claim 6, wherein said second cooling gas path is provided between the heat-insulating member and the heater.

9. The heat treatment apparatus according to claim 1, wherein said reaction chamber is an isothermal spherical reaction chamber.

10. The heat treatment apparatus according to claim 9, wherein said apparatus further comprises a temperature measuring means for measuring a temperature of the isothermal spherical reaction chamber, and said control means controls said cooling means based on the temperature of the isothermal spherical reaction chamber measured by said temperature measuring means and cooling characteristics stored in advance.

11. The heat treatment apparatus according to claim 9, wherein said heating means is provided so as to cover the isothermal spherical reaction chamber and includes a spherical heater which is turned on /off by said control means.

12. The heat treatment apparatus according to claim 11, wherein said insulating means includes a spherical heat-insulating member provided outside the spherical heater.

13. The heat treatment apparatus according to claim 12, wherein said first cooling gas path is provided between the spherical heater and the isothermal spherical reaction chamber.

14. The heat treatment apparatus according to claim 12, wherein said second cooling gas is provided between the spherical heat-insulating member and the spherical heater.

15. The heat treatment apparatus according to claim 1, wherein said cooling means includes a first cooling unit for cooling said reaction chamber by the gas flowing through said first cooling gas path and a second cooling unit for cooling said heating means by the gas flowing through said second cooling gas path.

16. The heat treatment apparatus according to claim 15, wherein said first cooling unit includes a first blower which is turned on/off by said control means to allow the gas to flow said first cooling gas path and a first radiator for cooling the gas flowing through said first cooling gas path, and said second cooling unit includes a second blower which is turned on/off by said control means to allow the gas to flow through said second cooling gas path and a second radiator for cooling the gas flowing through said second cooling gas path.

17. The heat treatment apparatus according to claim 15, wherein said first cooling unit includes a first blower for causing the gas to flow through said first cooling gas path, a first inverter for controlling a flow rate of the gas flowing through said first cooling gas path by varying an ON/OFF cycle of the first blower by said control means, and a first radiator for cooling the gas flowing through said first cooling gas path, and said second cooling unit includes a second blower for causing the gas to flow through said second cooling gas path, a second inverter for controlling a flow rate of the gas flowing through said second cooling gas path by varying an ON/OFF cycle of the second blower by said control means, and a second radiator for cooling the gas flowing through said second cooling gas path.

18. The heat treatment apparatus according to claim 15, wherein said first cooling unit includes a first blower for causing the gas to flow through said first cooling gas path, a first shutter interposed between said first cooling gas path and said first blower and opened/closed by said control means, and a first radiator for cooling the gas flowing through said first cooling gas path, and said second cooling unit includes a second blower for causing the gas to flow through said second cooling gas path, a second shutter interposed between said second cooling gas path and said second blower and opened/closed by said control means, and a second radiator for cooling the gas flowing through said second cooling gas path.

19. The heat treatment apparatus according to claim 18, further comprising a plurality of gas flow rate control valves whose opening/closing amounts are controlled by said control means to supply the gas to different points of said second cooling gas path.

20. The heat treatment apparatus according to claim 1, wherein said cooling means includes a blower which is turned on/off by said control means to allow the gas to flow through said first cooling gas path and said second cooling gas path, a first radiator for cooling the gas flowing through said first cooling gas path, a first gas flow rate control valve which is provided between the blower and the first radiator and whose opening/closing amount is controlled by said control means to control a flow rate of the gas flowing through said first cooling gas path, a second radiator for cooling the gas flowing through said second cooling gas path, and a second gas flow rate control valve which is provided between the blower and the second radiator and whose opening/closing amount is controlled by said control means to control a flow rate of the gas flowing through said second cooling gas path.

21. The heat treatment apparatus according to claim 1, wherein the gas flowing through said first cooling gas path and said second cooling gas path contains at least one of inert gas and air.

22. The heat treatment apparatus according to claim 1, wherein a direction in which the gas flows through said first cooling gas path is opposite to a direction in which the gas flows through said second gas path.

23. The heat treatment apparatus according to claim 1, wherein said control means includes a storage section in which cooling characteristics of said reaction chamber are stored.

24. The heat treatment apparatus according to claim 23, said cooling characteristics include data representing a relationship between cooling time required for cooling said reaction chamber and the temperature of said reaction chamber.

25. The heat treatment apparatus according to claim 1, wherein said control means increases a cooling speed by gas flowing from said cooling means to said first cooling gas path and said second cooling gas path when it is measured that the semiconductor wafers are cooled to about 600° C. to 700° C. by the gas flowing from said cooling means to said second cooling gas path.

26. The heat treatment apparatus according to claim 1, wherein said control means includes a storage section for storing data of difference in temperature of a surface of each of the semiconductor wafers with respect to the temperature of said reaction chamber to be cooled and data of stress applied to the semiconductor wafers with respect to the temperature of said reaction chamber.

27. The heat treatment apparatus according to claim 1, wherein said control means controls said cooling means such that a cooling speed at which said reaction chamber is cooled by said cooling means corresponds to a speed at which a crystal defect is prevented from occurring on the semiconductor wafers.

28. A heat treatment apparatus for semiconductor wafers, comprising:
   a reaction chamber for housing the semiconductor wafers;
   a heater provided outside said reaction chamber, for heating said reaction chamber;
   a heat-insulating member provided outside said heating means, for keeping a temperature of said reaction chamber;
   a first cooling gas path interposed between said reaction chamber and said heater;
   a second cooling gas path interposed between said heater and said heat-insulating member;
   a first blower for causing gas to flow through said first cooling gas path when said reaction chamber is cooled;
   a second blower for causing gas to flow through said second cooling gas path when said reaction chamber is cooled;
   a first radiator for cooling the gas flowing through said first cooling gas path;
   a second radiator for cooling the gas flowing through said second cooling gas path; and
   a controller for controlling said second blower to be in an ON state to cool said semiconductor wafers to one of a predetermined temperature and a predetermined temperature range, and then for controlling said first blower and said second blower to be in an ON state to further cool said semiconductor wafers.

29. The heat treatment apparatus according to claim 28, wherein said controller turns on said second blower to allow the gas to flow through said second cooling gas path and cool the semiconductor wafers to about 600° C. to 700° C. and then turns off said first blower and second blower to allow the gas to flow through said first cooling gas path and said second cooling gas path to accelerate the cooling speed.

30. The heat treatment apparatus according to claim 28, wherein said controller controls the ON and OFF states of said first blower and said second blower such that a cooling speed at which said reaction chamber is cooled corresponds to a speed at which composition of the semiconductor wafers is prevented from being changed.

31. The heat treatment apparatus according to claim 28, wherein the gas flowing through said first cooling gas path and said second cooling gas path is one of inert gas and air.

32. The heat treatment apparatus according to claim 28, wherein said reaction chamber includes a reaction tube and a soaking tube provided outside the reaction tube.

33. The heat treatment apparatus according to claim 28, wherein said reaction chamber is an isothermal spherical reaction chamber.

34. The heat treatment apparatus according to claim 33, wherein said heater and said heat-insulting member are spherical.

35. The heat treatment apparatus according to claim 28, wherein a direction in which the gas flows through said first cooling gas path is opposite to a direction in which the gas flows through said second gas path.

36. A heat treatment apparatus for semiconductor wafers, comprising:
   a reaction chamber for housing the semiconductor wafers;
   a heater provided outside said reaction chamber, for heating said reaction chamber;
   a heat-insulating member provided outside said heating means, for keeping a temperature of said reaction chamber;
   a first cooling gas path interposed between said reaction chamber and said heater;
   a second cooling gas path interposed between said heater and said heat-insulating member;
   a first blower for causing gas to flow through said first cooling gas path when said reaction chamber is cooled;
   a second blower for causing gas to flow through said second cooling gas path when said reaction chamber is cooled;
   a first radiator for cooling the gas flowing through said first cooling gas path;
   a second radiator for cooling the gas flowing through said second cooling gas path;
   a first inverter for intermittently driving said first blower;
   a second inverter for intermittently driving said second blower; and
   a controller for controlling said second inverter to be in an ON state for driving said second blower to cool the semiconductor wafers to one of a predetermined temperature and a predetermined temperature range, and then for controlling said first inverter and said second inverter to be in an ON state for respectively driving said first blower and said second blower to further cool the semiconductor wafers.

37. The heat treatment apparatus according to claim 36, wherein said controller drives said second inverter to control an ON/OFF cycle of said second blower, cause the gas to flow through said second cooling gas path and cool the semiconductor wafers to about 600° C. to 700° C., and then drives said first inverter and said second inverter to control ON/OFF cycles of said first blower and said second blower to cause the gas to flow through said first cooling path and said second cooling path thereby to accelerate the cooling speed.

38. The heat treatment apparatus according to claim 36, wherein said controller drives said first inverter and said second inverter to control the ON/OFF cycles of said first blower and said second blower such that the cooling speed at which said reaction chamber is cooled corresponds to a speed at which composition of the semiconductor wafers is prevented from being changed.

39. The heat treatment apparatus according to claim 36, wherein the gas flowing through said first cooling gas path and said second cooling gas path is one of inert gas and air.

40. The heat treatment apparatus according to claim 36, wherein said reaction chamber includes a reaction tube and a soaking tube provided outside the reaction tube.

41. The heat treatment apparatus according to claim 36, wherein said reaction chamber is an isothermal spherical reaction chamber.

42. The heat treatment apparatus according to claim 41, wherein said heater and said heat-insulting member are spherical.

43. The heat treatment apparatus according to claim 36, wherein a direction in which the gas flows through said first cooling gas path is opposite to a direction in which the gas flows through said second gas path.

44. A heat treatment apparatus for semiconductor wafers, comprising:

a reaction chamber for housing the semiconductor wafers;

a heater provided outside said reaction chamber, for heating said reaction chamber;

a heat-insulating member provided outside said heating means, for keeping a temperature of said reaction chamber;

a first cooling gas path interposed between said reaction chamber and said heater;

a second cooling gas path interposed between said heater and said heat-insulating member;

a first blower for causing gas to flow though said first cooling gas path when said reaction chamber is cooled;

a second blower for causing gas to flow through said second cooling gas path when said reaction chamber is cooled;

a first radiator for cooling the gas flowing through said first cooling gas path;

a second radiator for cooling the gas flowing through said second cooling gas path;

a first shutter for opening/closing said first cooling gas path;

a second shutter for opening/closing said second cooling gas path; and a controller for controlling said second shutter to open said second cooling gas path to cool said semiconductor wafers to one of a predetermined temperature and a predetermined temperature range, and then for controlling said first shutter and said second shutter to respectively open said first cooling path and said second cooling path to further cool the semiconductor wafers.

45. The heat treatment apparatus according to claim 44, wherein said controller opens said second shutter to cause the gas to flow through said second cooling gas path and cool the semiconductor wafers to about 600° C. to 700° C., and opens said first shutter and said second shutter to cause the gas to flow through said first cooling path and said second cooling path thereby to accelerate the cooling speed.

46. The heat treatment apparatus according to claim 44, wherein said controller controls the opening/closing of said first shutter and said second shutter such that the cooling speed at which said reaction chamber is cooled corresponds to a speed at which composition of the semiconductor wafers is prevented from being changed.

47. The heat treatment apparatus according to claim 44, wherein the gas flowing through said first cooling gas path and said second cooling gas path is one of inert gas and air.

48. The heat treatment apparatus according to claim 44, wherein said reaction chamber includes a reaction tube and a soaking tube provided outside the reaction tube.

49. The heat treatment apparatus according to claim 44, wherein said reaction chamber is an isothermal spherical reaction chamber.

50. The heat treatment apparatus according to claim 49, wherein said heater and said heat-insulting member are spherical.

51. The heat treatment apparatus according to claim 44, wherein a direction in which the gas flows through said first cooling gas path is opposite to a direction in which the gas flows through said second gas path.

52. A heat treatment apparatus for semiconductor wafers, comprising:

a reaction chamber for housing the semiconductor wafers;

a heater provided outside said reaction chamber, for heating said reaction chamber;

a heat-insulating member provided outside said heating means, for keeping a temperature of said reaction chamber;

a first cooling gas path interposed between said reaction chamber and said heater;

a second cooling gas path interposed between said heater and said heat-insulating member;

a blower for causing gas to flow though said first cooling gas path and said second cooling gas path when said reaction chamber is cooled;

a first radiator for cooling the gas flowing through said first cooling gas path;

a second radiator for cooling the gas flowing through said second cooling gas path;

a first gas flow rate control valve interposed between said blower and said first radiator;

a second gas flow rate control valve interposed between said blower and said second radiator; and a controller for controlling said second gas flow rate control valve to be open to cool said semiconductor wafers to one of a predetermined temperature and a predetermined temperature range, and then for controlling said first gas flow rate control valve and said second gas flow rate control valve to be open to further cool the semiconductor wafers.

53. The heat treatment apparatus according to claim 52, wherein said controller opens said second gas flow rate control valve to cause the gas to flow through said second cooling gas path and cool the semiconductor wafers to about 600° C. to 700° C., and then opens said first gas flow rate control valve and said second gas flow rate control valve to cause the gas to flow through said first cooling path and said second cooling path thereby to accelerate the cooling speed.

54. The heat treatment apparatus according to claim 52, wherein said controller controls the amounts of opening/ closing of said first gas flow rate control valve and said second gas flow rate control valve such that the cooling speed at which said reaction chamber is cooled corresponds to a speed at which composition of the semiconductor wafers is prevented from being changed.

55. The heat treatment apparatus according to claim 52, wherein the gas flowing through said first cooling gas path and said second cooling gas path is one of inert gas and air.

56. The heat treatment apparatus according to claim 52, wherein said reaction chamber includes a reaction tube and a soaking tube provided outside the reaction tube.

57. The heat treatment apparatus according to claim 52, wherein said reaction chamber is an isothermal spherical reaction chamber.

58. The heat treatment apparatus according to claim 57, wherein said heater and said heat-insulting member are spherical.

59. The heat treatment apparatus according to claim 52, wherein a direction in which the gas flows through said first cooling gas path is opposite to a direction in which the gas flows through said second gas path.

60. A heat treatment apparatus for semiconductor wafers, comprising:

a reaction chamber for housing the semiconductor wafers;

heating means provided outside said reaction chamber, for heating said reaction chamber;

insulating means provided outside said heating means, for keeping a temperature of said reaction chamber;

a first cooling gas path interposed between said reaction chamber and said heating means;

a second cooling gas path interposed between said heating means and said insulating means;

temperature measuring means for measuring the temperature within the reaction chamber and the first cooling gas path;

cooling means for cooling said reaction chamber by gas flowing through said first cooling gas path and said second cooling gas path; and control means, having storage means in which data on cooling characteristics is stored, for controlling said cooling means to decrease the temperature of said reaction chamber, wherein said control means controls the cooling means to cool said reaction chamber based on the temperature within said reaction chamber measured by said temperature measuring means, the temperature of the gas flowing in said first cooling gas path measured by said temperature measuring means, and the cooling characteristics stored in the storage means.

61. The heat treatment apparatus according to claim 60, wherein said temperature measuring means includes a first temperature measuring means for measuring the temperature within the reaction chamber and a plurality of second temperature measuring means for measuring the temperature of the first cooling gas path.

62. The heat treatment apparatus according to claim 60, wherein said control means includes PID (Proportion, Integration, Differential value) control for employing a cascade control method to control the cooling of the reaction chamber.

* * * * *

UNITED STATES PATENT AND TRADEMARK OFFICE
CERTIFICATE OF CORRECTION

PATENT NO. : 5,878,191
DATED : March 2, 1999
INVENTOR(S) : Naoto MIYASHITA et al.

It is certified that error appears in the above-identified patent and that said Letters Patent is hereby corrected as shown below:

Claim 34, Col. 14, line 28, "heat-insulting" should read --heat-insulating--.

Claim 42, Col. 15, line 28, "heat-insulting" should read --heat-insulating--.

Claim 50, Col. 16, line 24, "heat-insulting" should read --heat insulating--.

Claim 58, Col. 17, line 20, "heat-insulting" should read --heat insulating--.

Signed and Sealed this

Seventh Day of December, 1999

Attest:

Q. TODD DICKINSON

*Attesting Officer*  *Acting Commissioner of Patents and Trademarks*